US008681310B2

(12) United States Patent
Hotzel

(10) Patent No.: US 8,681,310 B2
(45) Date of Patent: Mar. 25, 2014

(54) MECHANICAL FIXTURE OF PELLICLE TO LITHOGRAPHIC PHOTOMASK

(75) Inventor: Arthur Hotzel, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 488 days.

(21) Appl. No.: 12/958,678

(22) Filed: Dec. 2, 2010

(65) Prior Publication Data

US 2012/0140199 A1 Jun. 7, 2012

(51) Int. Cl.
*G03B 27/32* (2006.01)
*G03B 27/42* (2006.01)
*G03B 27/52* (2006.01)
*G03B 27/62* (2006.01)

(52) U.S. Cl.
USPC ............... 355/30; 355/53; 355/75; 355/77

(58) Field of Classification Search
CPC .................................................. G03F 7/70983
USPC .......................................... 355/30, 53, 75, 77
See application file for complete search history.

(56) References Cited

U.S. PATENT DOCUMENTS

| 6,192,100 | B1 * | 2/2001 | Acosta et al. ........... 378/35 |
| 6,911,283 | B1 * | 6/2005 | Gordon et al. ........... 430/5 |
| 2004/0043309 | A1 * | 3/2004 | Lin ................ 430/22 |

FOREIGN PATENT DOCUMENTS

JP 11194481 A * 7/1999 ............ G03F 1/14

* cited by examiner

*Primary Examiner* — Toan Ton
*Assistant Examiner* — Colin Kreutzer
(74) *Attorney, Agent, or Firm* — Ditthavong Mori & Steiner, P.C.

(57) ABSTRACT

A pellicle frame is mechanically attached to a reticle, without use of an adhesive. An embodiment includes mechanically attaching a pellicle frame to a front surface of a reticle, removing the pellicle frame from the reticle, cleaning the reticle, and mechanically reattaching the pellicle frame to the reticle. Embodiments further include using a clamp to mechanically attach the pellicle frame to the reticle. Embodiments further include forming the pellicle frame with a flange having an opening in the center, and forming the clamp with two portions, one portion with a protrusion that fittingly engages the opening in the flange and with a second opening, and the second portion with a segment that extends behind the reticle and with a second protrusion that fittingly engages the second opening.

18 Claims, 8 Drawing Sheets

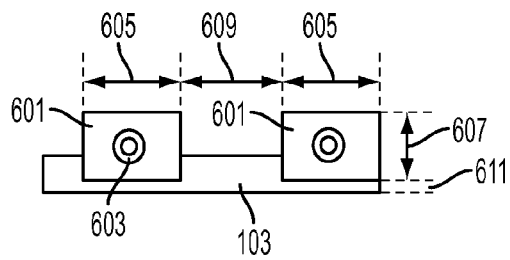
FIG. 6
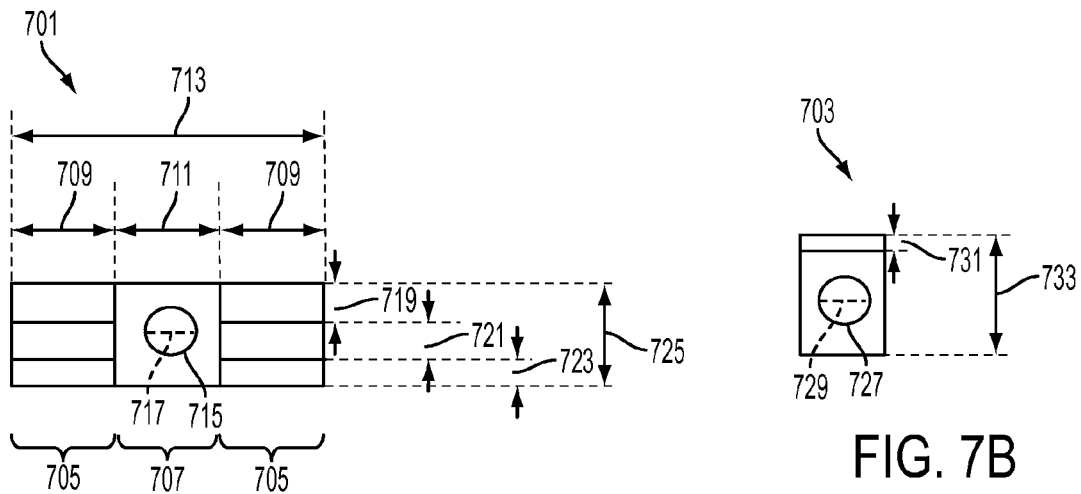
FIG. 7A
FIG. 7B
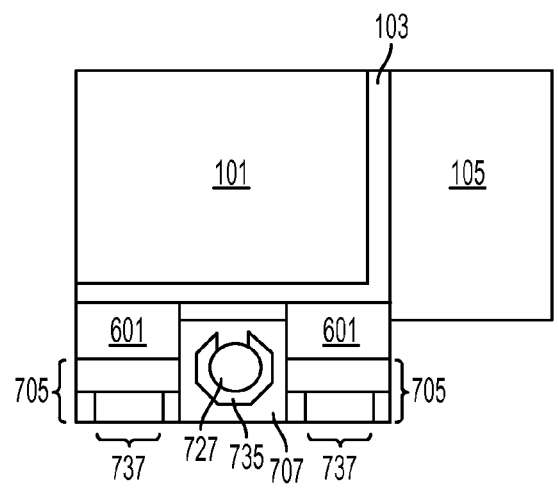
FIG. 7C

MECHANICAL FIXTURE OF PELLICLE TO LITHOGRAPHIC PHOTOMASK

TECHNICAL FIELD

The present disclosure relates to lithographic photomasks, or reticles, and to the attachment of protective pellicles thereon. The present disclosure is particularly applicable to technologies that employ 193 nanometer (nm) lithography, or technologies of 90 nm and beyond (i.e. <90 nm).

BACKGROUND

A lithographic photomask, or reticle, conventionally has a protective pellicle (thin organic membrane on a metal frame) that is glued to the front surface, or active side, of the reticle. In the following, the term pellicle is used for the combined membrane and frame. This pellicle often must be removed during the reticle lifetime, especially for a reticle exposed at 193 nm, which develops crystal growth (so-called haze) on the front surface under the pellicle during use. The haze must be removed regularly, typically at intervals of a few months, by cleaning the reticle (which requires removal of the pellicle). Aggressive cleaning processes, such as sulfuric acid and megasonic cleaning must be used to remove traces of the pellicle adhesive. Not only can these techniques lead to damage or additional contamination of the reticle, thereby requiring further repair, cleaning, and inspection, which are costly and time-consuming, but also sulfuric acid leaves sulfate residues, a known source for haze. Further, the reticle may be damaged beyond repair and require replacement. Moreover, the pellicle cannot be reused after being removed and, therefore, must be replaced. Consequently, the entire process must be performed in a mask shop, rather than in the semiconductor fabrication plant (fab), which further adds to the cycle time. Another consequence of the pellicle being glued to the reticle (and therefore not being easily removable) is that in the current standard reticle production flow, to avoid superfluous pellicle removal, a particle ("starlight") inspection prior to mounting the pellicle is required, in addition to the final post-pell inspection after pellicle mounting.

A need thus exists for methodology enabling a pellicle to be removably affixed to the reticle, without the use of an adhesive.

SUMMARY

An aspect of the present disclosure is a method of mechanically attaching a removable/reattachable pellicle to inactive portions of a reticle with no adhesive to facilitate cleaning of the reticle.

Another aspect of the present disclosure is a reticle with a removable/reattachable pellicle mechanically attached thereto by use of clamps which partially extend behind the reticle and which are either removably or firmly attached to the pellicle frame.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of mechanically attaching a pellicle frame to a front surface of a reticle; removing the pellicle frame from the reticle; cleaning the reticle; and mechanically reattaching the same pellicle frame or attaching another pellicle frame to the reticle.

Aspects of the present disclosure include mechanically attaching the pellicle to the reticle by: positioning a first portion of a mechanical device on the front side of the reticle and exerting pressure on the pellicle frame towards the reticle using the first portion; and positioning a second portion of a mechanical device on the back side of the reticle, the second portion being mechanically connected to the first portion, and exerting pressure on the back side of the reticle towards the pellicle using the second portion. Other aspects include positioning a mechanical device which comprises a clamp, and positioning the first and second portions in an inactive region of the reticle. Further aspects include forming the pellicle frame with a flange protruding outwardly from at least two segments of the pellicle frame; positioning the pellicle with each flange partially overlying the inactive region of the reticle; and mechanically attaching each flange to the reticle using a clamp. Another aspect includes forming an opening or protrusion in each flange, and forming a complementary protrusion or opening in a first segment of the first portion of each clamp, the first segment exerting pressure on the flange, and the complementary protrusion or opening fittingly engaging the opening or protrusion in the flange.

Additional aspects include each second portion comprising a first segment which partially extends behind the reticle. Other aspects include one portion further comprising a second segment having an opening; and the other portion comprising a second segment which protrudes through the opening, thereby connecting the two portions. Further aspects include positioning a middle region of each clamp in close contact with an edge of the reticle, thereby securing the pellicle against lateral movement in one direction. Another aspect includes forming a liner between the pellicle frame and the reticle, the liner being non-adhesive or an adhesive force between the liner and the reticle being sufficiently low to ensure that the liner is completely removable with the pellicle without leaving behind any residues.

Additional aspects include forming the pellicle frame with the first portion of the clamp firmly attached thereto, and mechanically attaching the pellicle frame to a front surface of the reticle by: partially extending the second portion of the clamp behind the reticle, the second portion being movable; and holding the second portion in position with a spring mechanism. Other aspects include removing the pellicle frame by: exerting pressure on the spring mechanism; and moving the second portion of the clamp away from behind the reticle.

Another aspect of the present disclosure is a device comprising: a reticle; a pellicle overlying the active area of the reticle and having a frame circumscribing the pellicle; the pellicle frame being mechanically attached to an inactive portion of the reticle, outwards from the active portion, and removable therefrom.

Aspects of the present disclosure include a device wherein the pellicle frame comprises a flange protruding outwardly from at least two segments of the pellicle frame, the flanges being removably mechanically attached to the inactive portion of the reticle. Further aspects include a clamp attaching each flange to the reticle. Other aspects include each flange comprising an opening or a protrusion, and the clamp fittingly engaged in the opening or a protrusion. Another aspect includes a clamp comprising a first portion having a first segment with a downward protrusion which fittingly engages the opening of the flange or with an opening which fittingly engages the protrusion of the flange; and a second portion having a first segment which partially extends behind the reticle; one portion further comprising a second segment having a second opening; and the other portion further comprising a second segment which protrudes through the second opening. Other aspects include a spring around the protrusion connecting the two portions; a retaining ring over the spring and compressing the spring; and a pin through the protrusion, above the retaining ring, holding the spring in the compressed position. Further aspects include the clamp comprising a first portion and a second portion, the first portion being firmly attached to the pellicle frame, and the second portion partially extending behind the reticle, the second portion being movable, the device further comprising a spring mechanism holding the second portion in position. Another aspect includes a liner between the pellicle frame and the reticle, the liner being non adhesive or an adhesive force between the liner and the reticle being sufficiently low to ensure that the liner is completely removable with the pellicle without leaving behind any residues.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 6 schematically illustrates an edge or side view of a pellicle frame with a clamp detached, in accordance with another exemplary embodiment;

FIG. 7A schematically illustrates a front view of a first portion of a clamp, FIG. 7B schematically illustrates a front view of a second portion of the clamp, and FIG. 7C schematically illustrates a front view of the first and second portions mechanically connecting a pellicle to a reticle, in accordance with another exemplary embodiment;

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure facilitates attachment and removal of a pellicle from a reticle for cleaning the reticle and reuse of both the pellicle and the reticle thereafter. In accordance with embodiments of the present disclosure, the pellicle is mechanically attached to the reticle outside the active area of the reticle. The pellicle frame is formed with a flange at each corner, each flange having an opening for engaging a protrusion from a first portion of a clamp. A second portion of the clamp extends behind the reticle and includes a protrusion which engages an opening in the first portion of the clamp. The two clamp portions are pressed together with the reticle and pellicle frame therebetween via a spring which is held in compression by a retaining ring. The clamp therefore removably seals the pellicle to the reticle. Since no adhesive is required for holding the pellicle and reticle together, no adhesive needs to be removed during reticle cleaning, and less aggressive cleaning processes, such as vapor cleaning, as described in copending application entitled, "Vapor Clean for Haze Removal from Lithographic Photomasks," filed on Dec. 2, 2010 as application Ser. No. 12/958,685 and issued as U.S. Pat. No. 8,518,189 on Aug. 27, 2013, may be employed, thereby significantly reducing the risk of damage or additional contamination.

Methodology in accordance with embodiments of the present disclosure includes mechanically attaching a pellicle frame to a front surface of a reticle, removing the pellicle frame from the reticle; cleaning the reticle, and mechanically reattaching the pellicle frame to the reticle.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
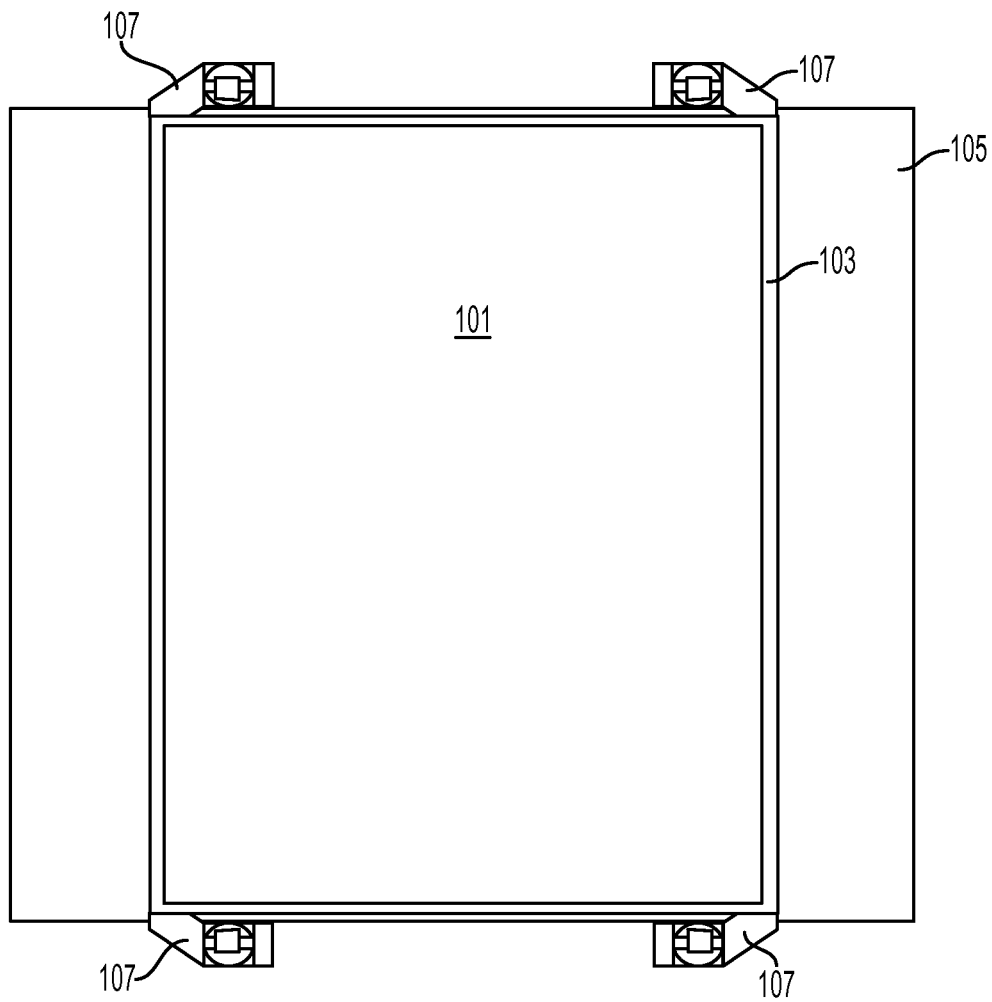
FIGS. 1A and 1B schematically illustrate front and edge views, respectively, of a pellicle mechanically attached to a reticle, in accordance with an embodiment of the present disclosure.
Figure 1B:
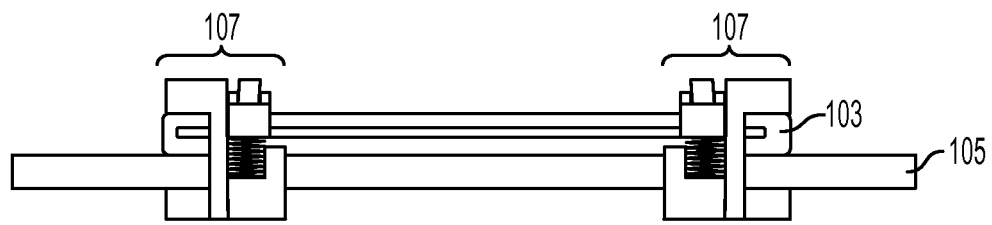
Figure 1C:
FIG. 1C schematically illustrates soft, non-adhesive liner formed between the pellicle frame and reticle, in accordance with an embodiment of the present disclosure.

FIGS. 1A and 1B schematically illustrate front and edge views, respectively, of a pellicle mechanically attached to a reticle in accordance with an embodiment of the present disclosure. As illustrated, pellicle 101 is circumscribed by frame 103, which in turn is removably affixed to reticle 105 via four clamps 107 outside of an active region of reticle 105. A middle portion of each clamp 107 may be in close contact with an edge of reticle 105. The pellicle is thereby secured against lateral movement in one direction by the clamps. Additional clamps may be employed along the sides of the pellicle to secure the pellicle in both directions. However, additional clamps may interfere with assist features on the reticle or with existing tools or other hardware used in combination with reticles. FIG. 1C illustrates that a soft, non-adhesive liner 109, for example a rubber gasket, may be formed between pellicle frame 103 and reticle 105 to improve the seal between the pellicle and the reticle. This liner might alternatively be weakly adhesive (for sealing purposes; not for the purpose of holding the pellicle in place), provided that the adhesive force between liner and reticle is sufficiently weak to ensure that the liner is completely removed with the pellicle without leaving any residues. For brevity, the liner will be assumed to be non-adhesive in the following.

Figure 2:
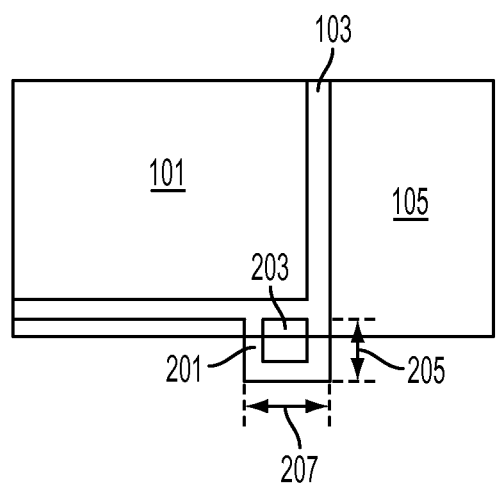
FIG. 2 schematically illustrates a partial front view of a reticle with a pellicle thereon prior to mechanical attachment, in accordance with an exemplary embodiment.

FIG. 2 illustrates a front view of a reticle 105 with a pellicle 101 thereon prior to mechanical attachment, in accordance with an exemplary embodiment. The reticle may be a conventional reticle, which is formed to a thickness of 6.35 millimeters (mm). As shown, pellicle frame 103 may be formed with an additional portion 201 at each corner, for example a ring or a square or rectangular flange (hereinafter referred to as flange 201) with an opening 203 in the center for engaging a portion of clamp 107. Although illustrated at the corners of pellicle frame 103, flanges 201 may be located at other positions along the edges of pellicle frame 103. The shape of opening 203 may be non-circular, for example rectangular, to secure clamp 107 against rotational movement. Flange 201 may extend 5 mm to 10 mm outward from the pellicle frame 103 (dimension 205 in FIG. 2), and 7 mm to 18 mm in a direction perpendicular thereto (illustrated at 207). Further, opening 203 may have dimensions of 3 mm to 6 mm in the direction parallel to 205, and 3 mm to 10 mm in the direction parallel to 207.

Figure 3A:
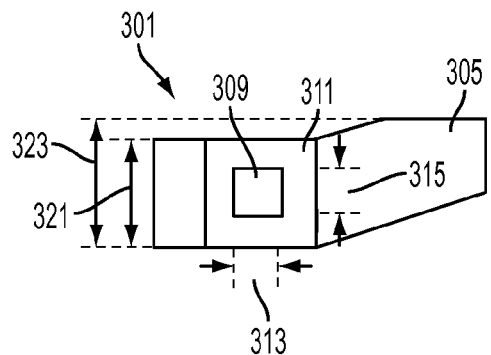
FIG. 3A schematically illustrates a front view of a first portion of a clamp, FIG. 3B schematically illustrates a front view of a second portion of the clamp, and FIG. 3C schematically illustrates a front view of the first and second portions mechanically connecting a pellicle to a reticle, in accordance with an exemplary embodiment.
Figure 3B:
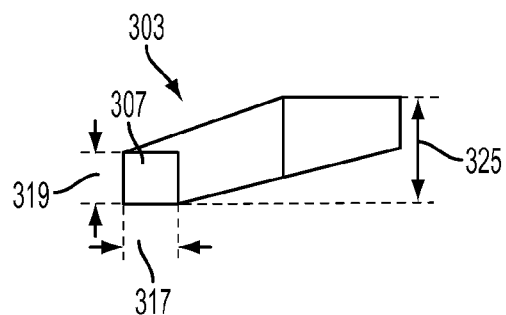
Figure 3C:
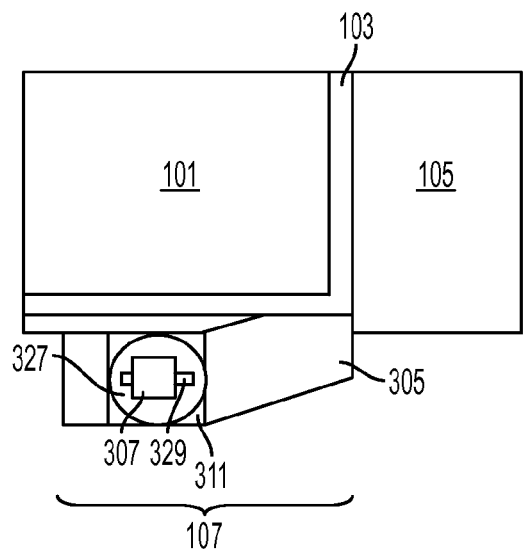
Figure 4A:
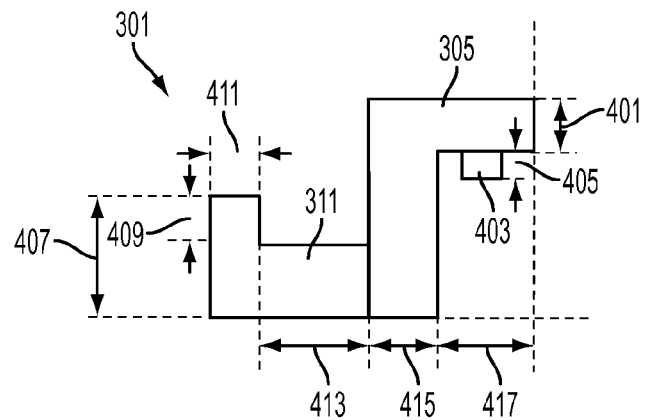
FIG. 4A schematically illustrates a side or edge view of the first clamp portion, FIG. 4B schematically illustrates a side or edge view of the second clamp portion, and FIG. 4C schematically illustrates a side or edge view of the two portions mechanically connecting a pellicle to a reticle, in accordance with an exemplary embodiment.
Figure 4B:
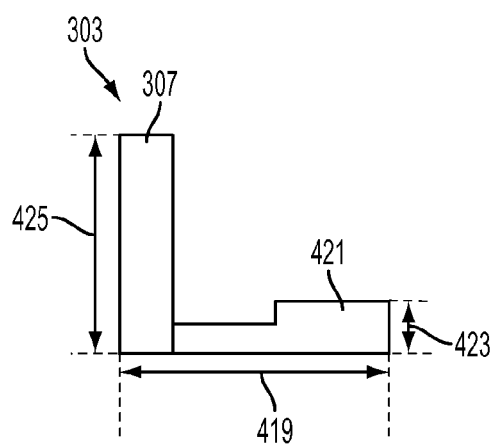
Figure 4C:
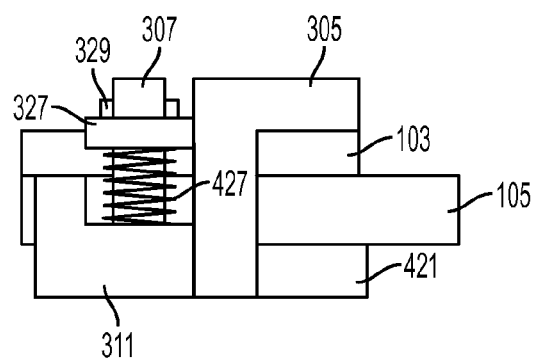
Figure 5A:
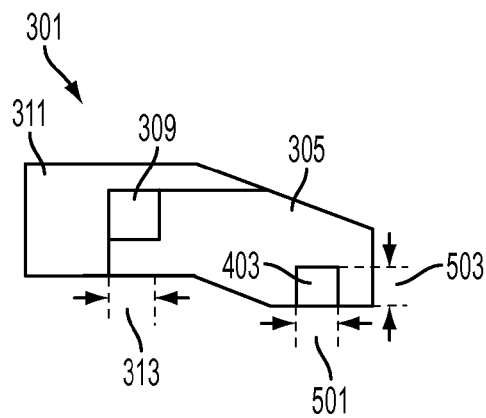
FIG. 5A schematically illustrates a back view of the first clamp portion, FIG. 5B schematically illustrates a back view of the second clamp portion, and FIG. 5C schematically illustrates a back view of the first and second clamp portions mechanically connecting a pellicle to a reticle, in accordance with an exemplary embodiment.
Figure 5B:
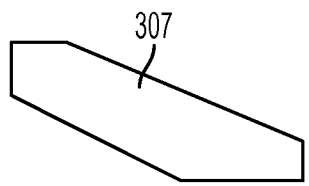
Figure 5C:
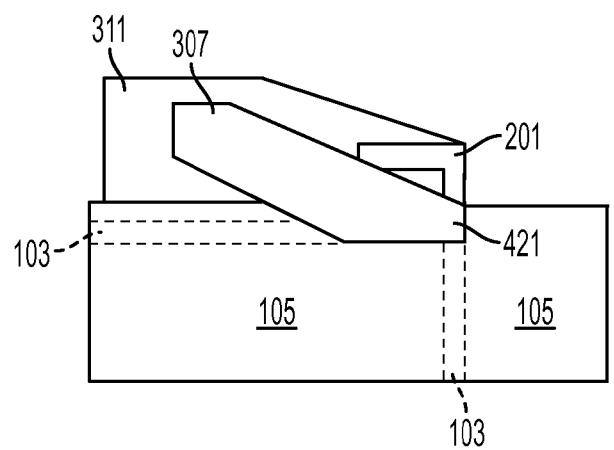

FIGS. 3A, 3B, and 3C illustrate a front view of a first portion 301 of clamp 107, a second portion 303 of clamp 107, and first and second portions 301 and 303 mechanically connecting pellicle 101 to reticle 105, respectively, in accordance with an exemplary embodiment. FIGS. 4A, 4B, and 4C, respectively, illustrate a side or edge view of first portion 301, second portion 303, and the two portions mechanically connecting pellicle 101 to reticle 105. FIGS. 5A, 5B, and 5C show a back view of first portion 301, second portion 303, and first and second portions 301 and 303 mechanically connecting pellicle frame 103 to reticle 105, respectively.

Clamp portions 301 and 303 may be formed of steel or aluminum. Adverting to FIGS. 3A through 3C, first portion 301 includes a first segment 305 which has a protrusion (illustrated in FIG. 4A) which engages opening 203 in flange 201. Alternatively, flange 201 may include a protrusion, and first segment 305 may include an opening that engages the protrusion (not shown for illustrative convenience). Second portion 303 includes a protrusion 307 which engages an opening 309 in a second segment 311 of first portion 301. Opening 309 may be formed to dimensions 313 by 315, in which 313 may be 3 mm to 10 mm and 315 may be 3 mm to 6 mm. Correspondingly, protrusion 307 may have dimensions 317 by 319, in which 317 may be 3 mm to 10 mm and 319 may be 3 mm to 6 mm. First portion 301 may further be formed with dimensions 321 of 7 mm to 14 mm and 323 of 8 mm to 24 mm, and second portion may further include dimension 325, which may be 6 mm to 22 mm. Clamp 107 further includes retaining ring 327 over protrusion 307, and pin 329 through protrusion 307 for securing the position of retaining ring 327, as shown in FIG. 3C.

As illustrated in FIGS. 4A through 4C, segment 305 has a thickness 401 of 3 mm to 6 mm, and includes protrusion 403, which extends 2 mm to 5 mm away from segment 305 into flange 201 (shown as dimension 405). Adverting to FIG. 5A, protrusion 403 may be formed with dimensions 501 being 3 mm to 10 mm and 503 being 3 mm to 6 mm. Further dimensions of second segment 311 shown in FIG. 4A include 407, which may be 8 mm to 14 mm, 409, which may be 0 mm to 5 mm, 411, which may be 3 mm to 10 mm, 413, which may be 5 mm to 16 mm, 415, which may be 3 mm to 10 mm, and 417, which may be 7 mm to 18 mm. Adverting to FIG. 4B, second portion 303 may have dimension 419 of 14 mm to 41 mm, and may include second segment 421 which extends behind the edge of reticle 105 (shown in FIG. 5C) and has dimension 423 of 4 mm to 8 mm. Protrusion 307 may extend 16 mm to 26 mm, as shown at 425.

As illustrated in FIG. 4C, a spring 427 may be formed over protrusion 307 and kept in compression by retaining ring 327 and pin 329. Spring 427 applies opposite pressure on flanges 201 and the back side of reticle 105, thereby providing sufficient force for portions 301 and 303 of clamp 107 to seal pellicle frame 103 to reticle 105. By virtue of spring 427, each clamp presses only in the vertical direction, thereby securing the pellicle against lateral movement, while exerting no strain on the reticle. By pressing protrusion 307 downwards and segment 311 upwards, further compressing the spring, clamp 107 is released and can be removed in the direction parallel to the reticle surface. After removing all clamps, the pellicle can be lifted off the reticle.

Alternatively, first portion 301 of clamp 107 may be permanently or semi-permanently attached to pellicle frame 103. Second portion 303 of clamp 107, which partially extends behind reticle 105 when pellicle 101 is attached, may then be moved away from behind the reticle (e.g., by rotation) to release pellicle 101. For example, as illustrated in FIG. 6 in accordance with a second exemplary embodiment, pellicle frame 103 may include two blocks 601, either formed integrally with pellicle frame 103 or attached permanently thereto, such as by welding, soldering, or gluing, and a first portion of clamp 107 may be attached thereto. Specifically, each block 601 may include threaded holes 603 for screwing or bolting the first clamp portion to the blocks, so that it stays permanently affixed at least during use of the pellicle. Each block 601 may have dimensions 605 and 607 of 6 mm to 10 mm and 4 mm to 8 mm, respectively, and be separated by a distance 609 of 6 mm to 10 mm. Blocks 601 may be located along an edge of pellicle frame 103, 0 mm to 1 mm from the back of frame 103 (shown at 611).

Figure 8A:
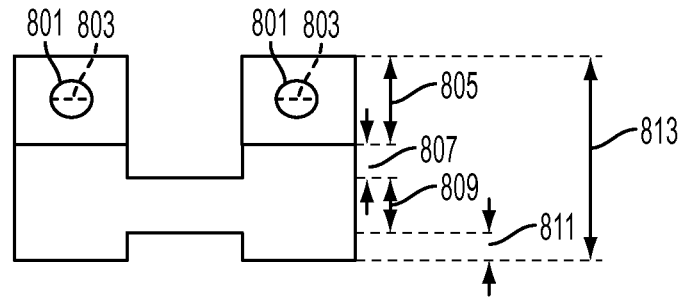
FIG. 8A schematically illustrates a first side or edge view of the first clamp portion, FIG. 8B schematically illustrates a first side or edge view of the second clamp portion, and FIG. 8C schematically illustrates a first side or edge view of the two portions mechanically connecting a pellicle to a reticle, in accordance with another exemplary embodiment.
Figure 8B:
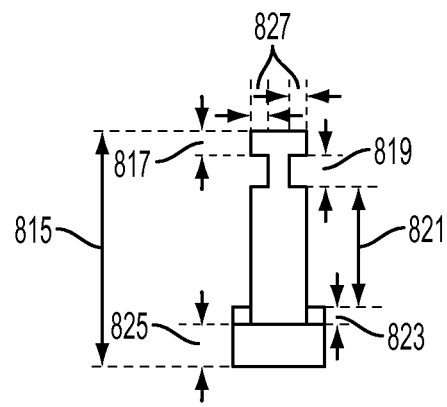
Figure 8C:
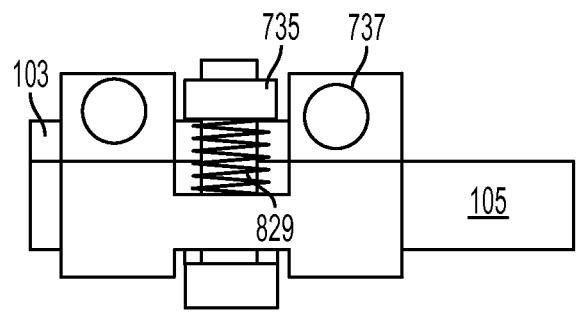
Figure 9A:
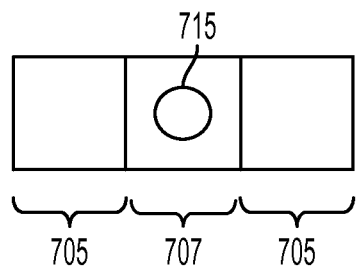
FIG. 9A schematically illustrates a back view of the first clamp portion, FIG. 9B schematically illustrates a back view of the second clamp portion, and FIG. 9C schematically illustrates a back view of the first and second clamp portions mechanically connecting a pellicle to a reticle, in accordance with another exemplary embodiment.
Figure 9B:
Figure 9C:
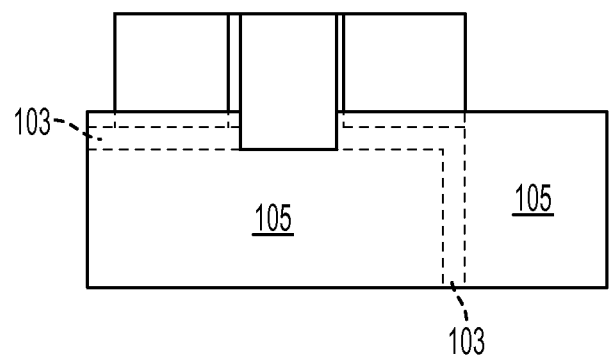
Figure 10A:
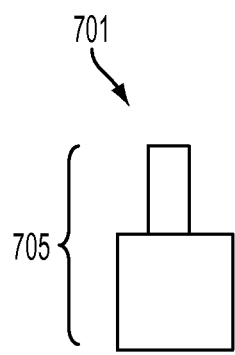
FIG. 10A schematically illustrates a second side or edge view of the first clamp portion, and FIG. 10B schematically illustrates a second side or edge view of the second clamp portion, in accordance with another exemplary embodiment.
Figure 10B:
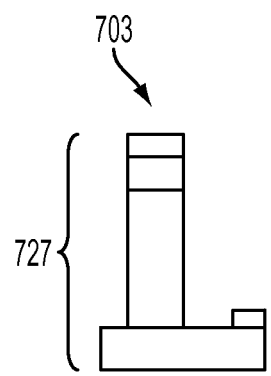

FIGS. 7A through 7C schematically illustrate a front view of a first portion 701 of clamp 107, a second portion 703 of clamp 107, and first and second portions 701 and 703 mechanically connecting pellicle 101 to reticle 105, respectively, in accordance with the second exemplary embodiment. FIGS. 8A, 8B, and 8C, respectively, illustrate a side or edge view of first portion 701, second portion 703, and the two portions mechanically connecting pellicle 101 to reticle 105. FIGS. 9A, 9B, and 9C show a back view of first portion 701, second portion 703, and first and second portions 701 and 703 mechanically connecting pellicle 101 to reticle 105, respectively. FIGS. 10A and 10B, respectively, schematically illustrate a second side or edge view of first portion 701 and second portion 703, in accordance with the second exemplary embodiment.

Adverting to FIGS. 7A to 7C, first portion 701 may include first segments 705 for attaching to blocks 601 and second segment 707 for connecting with second portion 703. First segments 705 may have a width 709 of 6 mm to 10 mm (corresponding to width 605 of blocks 601), second segment 707 may have a width 711 of 6 mm to 10 mm (corresponding to the space between blocks 601), and first portion 701 may have a total width 713 of 18 mm to 30 mm. Second segment 707 may include an opening 715 with diameter 717 of 3 mm to 8 mm, for receiving second portion 703. Other dimensions for first portion 701 include 719, 721, and 723, which may be 2 mm to 6 mm, 2 mm to 6 mm, and 0 mm to 3 mm, respectfully, and 725, which may be 6 mm to 12 mm.

As illustrated in FIG. 7B, second portion 703 includes a protrusion 727 with diameter 729 of 3 mm to 8 mm. Second portion extends behind reticle 105 with a protrusion at the end that presses onto the reticle back side that may have a length of 1 mm to 6 mm (shown as dimension 731). Further, dimension 733 of second portion 703 may be 9 mm to 18 mm. When first portion 701 and second portion 703 are connected to pellicle frame 103, as illustrated in FIG. 7C, a retaining ring 735 and a spring (shown in FIG. 8C) may hold protrusion 727 in opening 715. Further, screws or bolts 737 may affix first segments 705 to blocks 601.

FIG. 8A shows the location of openings 801 (with diameter 803 of 2 mm to 4 mm) in segments 705 for receiving screws or bolts 737. Further dimensions illustrated in FIG. 8A, i.e., dimensions 805, 807, 809, 811, and 813, may be 4 mm to 8 mm, 1 mm to 4 mm, 2 mm to 6 mm, 1 mm to 3 mm, and 11 mm to 21 mm, respectively. As illustrated in FIG. 8B, the height of protrusion 727 of second portion 703 may be 13 mm to 28 mm (shown as dimension 815). The remaining dimensions of second portion 703 may be as follows: 817 may be 1 mm to 3 mm, 819 may be 2 mm to 4 mm, 821 may be 6 mm to 12 mm, 823 may be 0 mm to 3 mm, 825 may be 2 mm to 6 mm, and 827 may be 1 mm to 2.5 mm. FIG. 8C illustrates the an edge view of the combination of portions 701 and 703 with pellicle frame 103 and reticle 105, including spring 829, which provides sufficient force to hold pellicle frame 103 and reticle 105 together.

The embodiments of the present disclosure achieve several technical effects, including eliminating the need for adhesive clean, reducing the risk of damage to the reticle during haze removal and allowing reuse of the pellicle, eliminating the need for a starlight inspection of the reticle prior to pellicle mounting, and allowing haze removal to be performed in the fab, thereby reducing cycle time. In addition, no physical changes to existing reticles are needed, only a minor change to existing pellicle frames is required, and the pellicle is secured without exerting strain on the reticle. Consequently manufacturing costs are reduced while throughput is increased. The present disclosure enjoys industrial applicability in any of various types of highly integrated semiconductor devices, especially 90 nm node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a pellicle frame with a flange protruding laterally outwardly from each of at least two segments of the pellicle frame;
    mechanically attaching the pellicle frame at each flange to a front surface of a reticle by:
        positioning a first portion of a mechanical device on the front side of the reticle and exerting pressure on the pellicle frame at the flange towards the reticle using the first portion; and
        positioning a second portion of a mechanical device on the back side of the reticle, the second portion being mechanically connected to the first portion, and exerting pressure on the back side of the reticle towards the pellicle using the second portion;
    removing the pellicle frame from the reticle;
    cleaning the reticle; and
    mechanically reattaching the same pellicle frame or attaching another pellicle frame to the reticle.

2. The method as recited in claim 1, wherein the mechanical device comprises a clamp, the method further comprising positioning the first and second portions in an inactive region of the reticle.

3. The method as recited in claim 2, further comprising:
    positioning the pellicle with each flange partially overlying the inactive region of the reticle; and
    mechanically attaching the flanges to the reticle using the clamps.

4. The method as recited in claim 3, further comprising:
    forming an opening or protrusion in each flange, and
    forming a complementary protrusion or opening in a first segment of the first portion of each clamp, the first segment exerting pressure on the flange, and the complementary protrusion or opening fittingly engaging the opening or protrusion in the flange.

5. The method as recited in claim 4, wherein:
    each second portion comprises a first segment which partially extends behind the reticle.

6. The method as recited in claim 5, wherein:
    one portion further comprises a second segment having an opening; and
    the other portion comprises a second segment which protrudes through the opening, thereby connecting the two portions.

7. The method as recited in claim 2, further comprising:
    positioning a middle region of each clamp in close contact with an edge of the reticle, thereby securing the pellicle against lateral movement in one direction.

8. The method as recited in claim 2, further comprising:
    forming the pellicle frame with the first portion of the clamp firmly attached thereto, and
    mechanically attaching the pellicle frame to a front surface of the reticle by:
        partially extending the second portion of the clamp behind the reticle, the second portion being movable; and
        holding the second portion in position with a spring mechanism.

9. The method as recited in claim 8, comprising removing the pellicle frame by:
   exerting pressure on the spring mechanism; and
   moving the second portion of the clamp away from behind the reticle.

10. The method as recited in claim 1, further comprising forming a liner between the pellicle frame and the reticle, the liner being non-adhesive or an adhesive force between the liner and the reticle being sufficiently low to ensure that the liner is completely removable with the pellicle without leaving behind any residues.

11. A device comprising:
   a reticle;
   a pellicle overlying the active area of the reticle and having a frame circumscribing the pellicle;
   the pellicle frame comprising a flange protruding laterally outwardly from each of at least two segments of the pellicle frame, each flange being mechanically attached to an inactive portion of the reticle, outwards from the active portion, and removable therefrom, by an element having a first portion exerting pressure on the flange toward the reticle and a second portion on the back side of the reticle, the first and second portions being mechanically connected to each other.

12. The device as recited in claim 11, wherein the element comprises a clamp.

13. The device as recited in claim 12 wherein each flange comprises an opening or a protrusion, and the clamp fittingly engaged in the opening or the protrusion.

14. The device as recited in claim 13 wherein:
   the first portion has a first segment with a downward protrusion or an opening which fittingly engages the opening or the protrusion of the flange; and
   the second portion has a first segment which partially extends behind the reticle; and
   one portion further comprises a second segment having a second opening; and
   the other portion further comprises a second segment which protrudes through the second opening.

15. The device as recited in claim 14 further comprising:
   a spring around the protrusion connecting the two portions;
   a retaining ring over the spring and compressing the spring; and
   a pin through the protrusion, above the retaining ring, holding the spring in the compressed position.

16. The device as recited in claim 12 wherein the first portion is firmly attached to the pellicle frame, and the second portion partially extends behind the reticle, the second portion being movable, the device further comprising a spring mechanism holding the second portion in position.

17. The device as recited in claim 11 further comprising:
   a liner between the pellicle frame and the reticle, the liner being non adhesive or an adhesive force between the liner and the reticle being sufficiently low to ensure that the liner is completely removable with the pellicle without leaving behind any residues.

18. A method comprising:
   forming a pellicle frame around a pellicle, the pellicle frame having a ring laterally outwards from each corner, the ring having an opening;
   positioning the pellicle with each ring partially overlying a reticle; and
   clamping the rings to the reticle.

* * * * *